United States Patent
Armstrong

[11] 4,058,743
[45] Nov. 15, 1977

[54] PULSE GENERATING CIRCUIT

[75] Inventor: Desmond Ross Armstrong, Kidlington, England

[73] Assignee: U.S. Philips Corporation, New York, N.Y.

[21] Appl. No.: 558,017

[22] Filed: Mar. 13, 1975

[30] Foreign Application Priority Data

Mar. 29, 1974 United Kingdom ............... 13996/74

[51] Int. Cl.² ........................................... H03K 17/00
[52] U.S. Cl. .................................. 307/275; 307/282; 307/294
[58] Field of Search ............... 307/282, 275, 294, 314; 331/112

[56] References Cited

U.S. PATENT DOCUMENTS

| | | | |
|---|---|---|---|
| 3,131,327 | 4/1964 | Quinn | 307/282 |
| 3,140,423 | 7/1964 | Roberts et al. | 307/282 |
| 3,657,569 | 4/1972 | Froeschle | 331/112 |
| 3,702,961 | 11/1972 | Erickson | 331/112 |

*Primary Examiner*—Stanley D. Miller, Jr.
*Assistant Examiner*—B. P. Davis
*Attorney, Agent, or Firm*—Frank R. Trifari; Bernard Franzblau

[57] ABSTRACT

A pulse is generated in an output transformer and this pulse is used to provide a spark across a spark gap for the purpose of igniting any gas/air mixture present. The circuit operates from a 1.5 volt d.c. source.

A blocking oscillator is energized by a two position switch which is operated to a first position, and this charges a capacitor. The capacitor is then discharged through an output transformer to produce the spark when the switch is returned to its original rest position. The winding used to charge the capacitor from the blocking oscillator is also used in the discharge path for the capacitor and this inductive loading provides a slower discharge and a more controlled lower energy spark which is found to be better for gas ignition.

13 Claims, 1 Drawing Figure

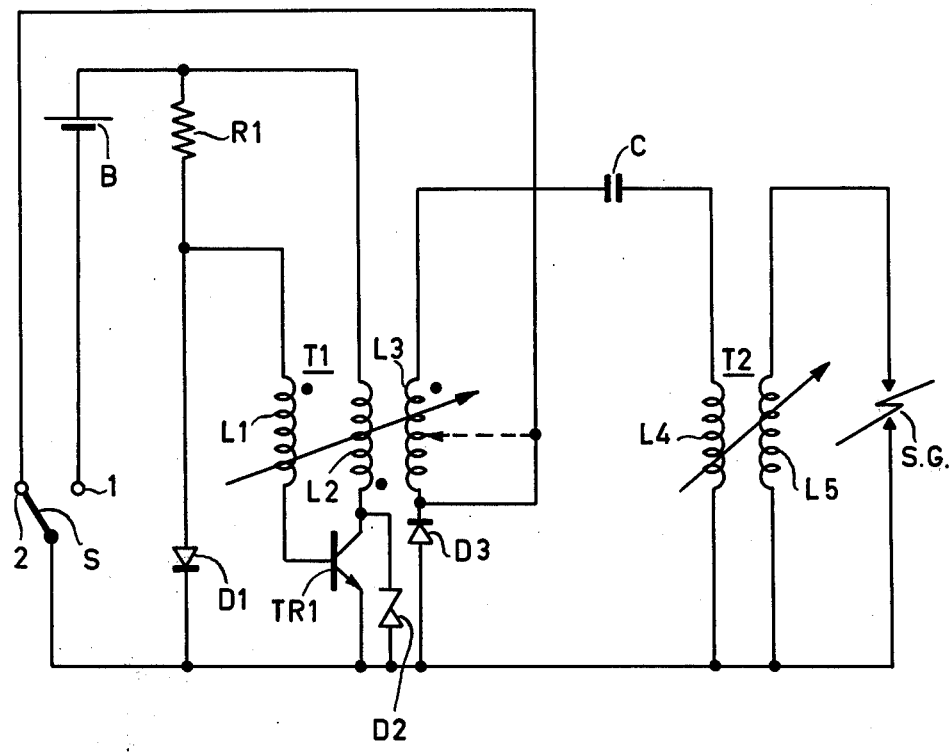

PULSE GENERATING CIRCUIT

The present invention relates to a pulse generator circuit and more particularly to a circuit which can generate a high voltage pulse, suitable for lighting the gas from a gas cigarette lighter, from a low voltage d.c. source.

According to the present invention there is provided a pulse generating circuit including a first transformer the primary winding of which is connected in an oscillator circuit and the secondary winding of which is connected with a capacitor and diode in a charging path. The capacitor also is connected with the primary winding of a second transformer in a discharge path upon the operation of a switch, resulting in a pulse being generated through a secondary winding of the second transformer upon discharge of the capacitor. The invention is characterized in that the capacitor discharge path includes a part or the whole of the secondary winding of the first transformer.

An embodiment of the present invention will now be described, by way of example, with reference to the accompanying drawing which shows a circuit diagram of a pulse generating circuit.

An oscillator circuit is formed by a transistor TR1, windings $L_1$, $L_2$ of a transformer $T_1$, diode $D_1$, Zener diode $D_2$ and a resistor $R_1$. Battery $B_1$ provides a low voltage d.c. supply which is connectable to the oscillator by means of a terminal 1 of a switch S.

A further winding L 3 of transformer $T_1$ is connected in series with a diode $D_3$ and a primary winding $L_4$ of a second transformer $T_2$ to form a charging path for a capacitor C.

A secndary winding L 5 of transformer $T_2$ is connected across a spark gap S.G. which is shown symbolically. A discharge path for the capacitor C is formed by the winding L 3 of the first transformer $T_1$, the switch S when placed in position 2, and the primary winding $L_4$ of transformer $T_2$.

The operation of the circuit is as follows. The rest position for the switch S is in position 2 and the switch in a preferred embodiment is so arranged that it is spring biassed towards that position. The switch S is operated to position 1 which connects the battery B across the series combination of resistor $R_1$ and diode $D_1$. The diode $D_1$ is a bias stabiliser since it has a voltage drop similar to the voltage Vbe of transistor TR1 and therefore allows the oscillator to operate with a large variation in supply voltage. This is particularly valuable with low voltage supplies of the order of 1.5 volts from battery B.

Transistor TR1 turns ON and due to the coupling between coils $L_1$ and $L_2$ of transformer $T_1$ is turned OFF again by means of the known ringing choke action.

When transistor TR1 is ON the coils $L_1$ and $L_2$ store energy and when TR1 is turned OFF this energy is transferred via winding $L_3$ to capacitor C, the diode $D_3$ preventing loss of energy from capacitor C via winding $L_4$.

As the ringing choke action continues the capacitor C is charged up so that the voltage across the capacitor C builds up. If this were allowed to continue the voltage rating of the capacitor C might well be exceeded and therefore Zener diode $D_2$ is included in the oscillator circuit to limit the collector swing of transistor TR1 and therefore to limit the transformed voltage which charges capacitor C.

When the capacitor C is charged the switch S is returned to its rest position 2. A discharge path for the capacitor is now formed via winding $L_3$, switch S and primary winding $L_4$ of transformer $T_2$. A spark is produced across the spark gap S.G. since the transformer $T_2$ is arranged to have a high step up ratio (approxiamately 1 : 30). It is also, in a further embodiment, possible to have the blocking oscillator continuously running and to discharge the capacitor by using a single make contact switch.

An advantage of using the winding $L_3$ in the discharge path is found in the use of the spark produced across the spark gap S.G. in igniting a gas/air mixture such as is found in gas cigarette lighters or in gas appliances. This advantage is that the winding $L_3$ provides a leakage inductance which controls the initial surge of current in the primary winding $L_4$ and as a result the spark current is controlled to provide a longer lasting spark at a lower energy level. Such a spark is found to be better for gas ignition than the otherwise obtained short duration high energy spark.

The winding $L_3$ also results in a substantial reduction in peak current through contact 2, which makes it possible to use a smaller contact. In a practical system the current reduction is from 40 amps down to 6 amps. Since the contact may normally be expected to bounce, the reduction in current improves the reliability of such a contact.

In a further embodiment, contact 2 of the switch S may be connected to a tapping on the secondary of transformer $T_1$ as shown in dotted lines. This allows a compromise to be obtained between the discharge part of the inductance of $L_3$ and the inductance of the primary winding $L_4$ so as to provide a better compromise between the initial spark current and the spark duration.

I claim:

1. A pulse generating circuit comprising a first transformer having a primary winding connected in an oscillator circuit and a secondary winding connected with a diode to a capacitor to provide a charge path for the capacitor, a switch, means connecting the capacitor with the primary winding of a second transformer, and circuit means including at least a part of the secondary winding of the first transformer, the switch and the primary winding of the second transformer for providing a discharge path for the capacitor such that operation of the switch results in a pulse being generated through a secondary winding of the second transformer upon discharge of the capacitor.

2. A pulse generating circuit as claimed in claim 1 wherein the circuit means providing said discharge path includes the capacitor, a part or the whole of the secondary winding of the first transformer, the primary winding of the second transformer and a make contact of the switch.

3. A pulse generating circuit as claimed in claim 1 wherein the oscillator circuit comprises a transistorised blocking oscillator including a single switching transistor.

4. A pulse generating circuit as claimed in claim 3 wherein the primary winding of the first transformer is included in the collector circuit of the switching transistor and further comprises a feedback winding inductively coupled to said primary winding of the first transformer and connected in the base circuit of the switching transistor.

5. A pulse generating circuit as claimed in claim 4 further comprising a second diode coupled to the input circuit of the transistor so as to bias the switching transistor.

6. A pulse generating circuit as claimed in claim 4 further comprising a Zener diode connected to the collector of the transistor so as to limit the collector voltage.

7. A pulse generating circuit as claimed in claim 1 in which the switch is a two position switch having a first position in which it couples a DC operating voltage to the oscillator circuit and a second position in which it causes the pulse to be generated by completing the capacitor discharge path.

8. A pulse generating circuit comprising a semiconductor amplifier, inductor means coupled to said amplifier, a capacitor, a diode, switching means, a transformer having a primary winding and a secondary winding, first means connecting a part of the inductor means, the diode, and the primary winding of the transformer to the capacitor so as to provide a charge circuit for the capacitor, and second means connecting at least a part of the inductor means, the switching means and said primary winding to the capacitor so as to provide a discharge circuit for the capacitor, operation of said switching means causing the capacitor to discharge and generate an electric pulse in the secondary winding of the transformer.

9. A pulse generating circuit comprising a semiconductor amplifier, inductor means coupled to said amplifier, a capacitor, a diode, switching means, a transformer having a primary winding and a secondary winding, first means connecting a part of the inductor means, the diode, the primary winding and the capacitor in a first series circuit so as to provide a charge circuit for the capacitor, and second means connecting at least a part of the inductor means, the switching means, the primary winding and the capacitor in a second series circuit so as to provide a discharge circuit for the capacitor, operation of said switching means causing the capacitor the discharge and generate an electric pulse in the secondary winding of the transformer.

10. A pulse generating circuit comprising a semiconductor amplifier, a capacitor, a diode, switching, means a first transformer having a primary winding and a secondary winding, inductor means comprising a second transformer having a first winding coupled to an output electrode of the semiconductor amplifier and a second winding, first means connecting said second winding, the diode, and the primary winding of the first transformer to the capacitor so as to provide a charge circuit for the capacitor, and second means connecting at least a part of the second winding, the switching means and said primary winding to the capacitor so as to provide a discharge circuit for the capacitor, operation of said switching means causing the capacitor to discharge and generate an electric pulse in the secondary winding of the first transformer.

11. A pulse generating circuit as claimed in claim 10 wherein said switching means includes first and second positions, said first position coupling a source of DC operating voltage to the semiconductor amplifier while opening the capacitor discharge circuit and the second position closing the capacitor discharge circuit to allow the capacitor to discharge and thereby generate said electric pulse in said secondary winding.

12. A pulse generating circuit as claimed in claim 10 wherein the second transformer includes a third winding and the semiconductor amplifier comprises a transistor with its collector and base electrodes inductively coupled via said first and third windings so as to form a blocking oscillator circuit, and further comprising a Zener diode coupled to said collector electrode to limit the collector voltage swing.

13. A pulse generating circuit as claimed in claim 10 wherein said first connecting means connects the second winding, the diode, the primary winding and the capacitor in a first series circuit, and said second connecting means connects at least a part of the second winding, the switching means, the primary winding and the capacitor in a second series circuit.

* * * * *